Jan. 14, 1964 R. M. McLOUSKI 3,117,899

PROCESS FOR MAKING SEMICONDUCTOR DEVICES

Filed July 18, 1960

WITNESSES:

INVENTOR
Raymond M. McLouski
BY
ATTORNEY

United States Patent Office 3,117,899
Patented Jan. 14, 1964

3,117,899

PROCESS FOR MAKING SEMICONDUCTOR DEVICES

Raymond M. McLouski, Glen Burnie, Md., assignor to Westinghouse Electric Corporation, East Pittsburgh, Pa., a corporation of Pennsylvania Filed July 18, 1960, Ser. No. 43,483
3 Claims. (Cl. 156—17)

The present invention relates to a novel process for preparing a semiconductor device, having a p-n junction portion with tunnel diode characteristics, with improved electrical properties.

In the fabrication of semiconductor devices having tunnel diode characteristics, the device parameters that must be controlled are the peak current and the ratio of peak-to-valley current. This can be accomplished by controlled fusion which determines depth and area of the junction and subsequent etching down to the desired value for peak current. Typical of the etching processes heretofore used is an electrolytic etch in sodium hydroxide solution or an acid etch in $CP_3$. The former method is extremely slow, the latter is faster, but both methods require constant handling and checking of the electrical characteristics of the diode, which results in a time consuming, tedious etching process. This is due to the fact that the diode in either process must be washed in water, rinsed and checked, usually employing a curve tracer for the peak current value. If the junction is etched beyond a certain point the ratio of peak-to-valley current is degraded. Consequently, very often, the desired ratio value is seriously degraded or the diode may be destroyed because of the variation in etching rates among individual diodes unless unusually frequent checks are employed to catch the peak ratio value.

An object of the present invention is to provide a solution having a low conductivity medium for etching a semiconductor device having a p-n junction portion with tunnel diode characteristics, the solution comprising by volume from 1 to 10 parts of 90% fuming red nitric acid, from 1 to 15 parts of 80% acetic acid, from 1 to 10 parts of 50% hydrofluoric acid and from 0.1 to 4 ml. of bromine per 100 ml. of the solution.

Another object of the invention is to provide a process for making a semiconductor device having a p-n junction portion with tunnel diode characteristics by preparing the device with a portion having the tunnel characteristics in a degree less than optimally possible, subjecting the portion to a low electrical conductivity chemical etchant comprising by volume from 1 to 10 parts of 90% fuming red nitric acid, from 1 to 15 parts of 80% acetic acid, from 1 to 10 parts of 50% hydrofluoric acid and from 0.1 to 4 ml. of bromine per 100 ml. of solution and continuously measuring the peak-to-valley current ratio at the p-n junction of the device while immersed in the etchant as etching progresses until the desired ratio is attained.

Other objects of the invention will in part, be obvious and will in part, appear hereinafter.

For a better understanding of the nature and objects of the invention, reference should be had to the detailed description and drawings, in which.

In accordance with the present invention and in attainment of the foregoing objects, there is provided a novel process for making a semiconductor device having a p-n junction portion with predetermined high tunnel diode characteristics. The semiconductor device is prepared to provide a p-n junction portion having tunnel characteristics in a degree less than optimally possible; leads are then attached to each side of the p-n junction. Finally, a low electrical conductivity chemical etchant is applied to the junction portion and forward current is passed continuously or from time to time through the p-n junction as etching progresses and the current passed to an oscilloscope or an XY recorder or any other suitable current sensing devices so as to measure the peak-to-valley current ratio at the junction. The etching solution comprises by volume from 1 to 10 parts of 90% fuming red nitric acid, from 1 to 15 parts of 80% acetic acid, from 1 to 10 parts of 50% hydrofluoric acid and from 0.1 to 4 ml. of bromine per 100 ml. of solution. The etching is continued until the desired or optimum peak-to-valley current ratio at the junction is attained as evidenced on the oscilloscope.

The best results have been obtained with an etchant solution comprising by volume 5 parts of 90% fuming red nitric acid, 10 parts concentrated acetic acid (80%) 3 parts of 50% hydrofluoric acid and 0.5 milliliter of bromine/100 milliliters of the solution.

Specific examples of the etchant compositions, in which all parts are by volume, are:

(1) 5 parts of red fuming nitric acid, 6 parts of acetic acid, 3 parts of hydrofluoric acid and 0.5 ml. of bromine per 100 ml. of solution.

(2) 5 parts of red fuming nitric acid, 8 parts of acetic acid, 2 parts of hydrogen fluoride and 0.7 ml. of bromine per 100 ml. of solution.

It should be understood that the concentrations of the various acid components may be varied from those given. Thus, acids of up to 100% concentration can be employed and enough water is added to the solution or another acid of lower strength used to attain the above mentioned concentrations.

Figure 1:
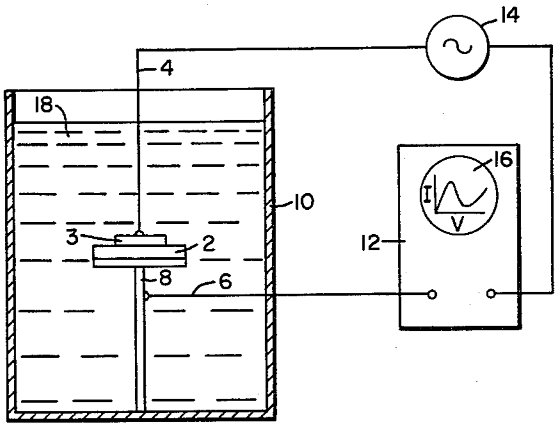
FIG. 1 is an elevation view partly in cross section, of a semiconductor device being prepared in accordance with the process of the invention.

With reference to FIG. 1, there is shown a monitored etching system 1. A semiconductor device 2 comprising a semiconductor member comprising a semiconductor material, such as silicon, germanium or gallium arsenide, having a p-n junction portion 3 is prepared to provide tunnel diode characteristics in a degree which ordinarily is less than optimally possible. A lead 4 is attached to one end of the device 2 and similarly, a lead 6 may be either attached to the other end of the device or to an electrically conductive non-reactive support 8 on which the device is placed as is indicated in FIG. 1. The support 8 is seated within a non-electrically conductive non-reactive enclosure 10. The other ends of leads 4 and 6 are attached to an oscilloscope 12 which is in series in the system. A forward current from a source 14 is then passed through the p-n junction 3 to measure the initial peak-to-valley current ratio at the junction. Prior to etching, selected parts of the device 2 may be masked with a protective coating, such as an acid resistive wax, to ensure that certain areas of the device are not attacked by the chemical etchant. A chemical etchant 18 is then placed in the enclosure 10 to cover the device 2 and the etchant immediately begins to etch the exposed areas of device 2. A forward current from source 14 is then passed either continuously or from time to time through the p-n junction as etching progresses to measure the peak-to-valley current ratio at the junction and the I-V characteristics are indicated on curve tracer 16 of the oscilloscope 12. The etching is continued until the desired high or optimum peak-to-valley ratio at the junction is attained.

The following example is illustrative of the teachings of the invention.

Figure 2:
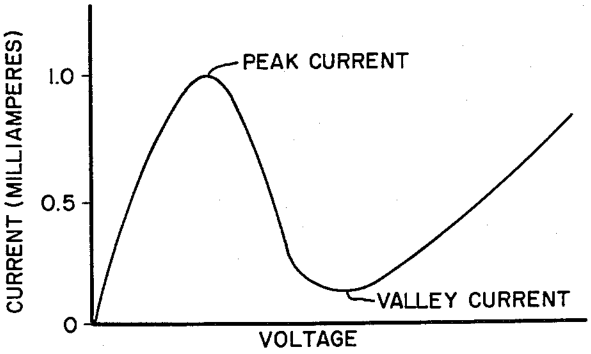
FIG. 2 is a graph showing a trace of the peak-to-valley current ratio of a semiconductor device prepared in accordance with the process of the invention.

A semiconductor device comprising a semiconductor member comprising germanium having a p-n junction portion with tunnel diode characteristics, with leads being attached to opposite sides of the junction, was placed on a support seated within a non-electrically conductive, non-reactive enclosure. Thereafter, the other ends of the leads were attached to an oscilloscope and the initial peak-to-valley current ratio measured which was about 2:1, i.e., 100 ma.; 50 ma. A chemical etchant comprising by volume 5 parts of 90% of fuming red nitric acid, 10 parts of 80% acetic acid, 4 parts of 50% hydrofluoric acid and 0.5 milliliters of bromine/100 millileters of solution was placed in the enclosure containing the device in an amount to cover the device. This etchant enabled the monitoring of peak currents to as low as 1 milliampere. When extreme care is taken, peak currents as low as 1 microampere can be measured. A forward current was passed through the p-n junction as etching progressed and the peak-to-valley current ratio at the junction was measured until a ratio of 10:1 (1 ma. to 0.1 ma.) was attained. The etchant was relatively non-electrically conductive so that the current from source 14 was not short circuited. The diode was then removed from the etch and washed with water. The curve that was delineated on the curve tracer of the oscilloscope is shown in FIG. 2.

Typical examples of other tunnel diodes etched by the process are as follows:

| Diode No. | Before Etching | | | After Etching | | |
|---|---|---|---|---|---|---|
| | Peak Current, ma. | Valley Current, ma. | Ratio | Peak | Valley | Ratio |
| 60 | 90 | 40 | 2.25 | 58 | 7 | 8.3 |
| 62 | 225 | 200 | 1.13 | 52 | 5 | 10.4 |
| 65 | 141 | 40 | 3.5 | 5.0 | 0.5 | 10 |
| 80 | 145 | 140 | 1.03 | 1.0 | 0.1 | 10 |
| 106 | 180 | 40 | 4.5 | 10.2 | 1.0 | 10.2 |

While the peak-to-valley current ratios shown in the data have been obtained for germanium, different ratios may be obtained for other semiconductor materials. For example, the ratio may be as high as 6:1 for silicon and 60:1 for gallium arsenide.

Figure 3:
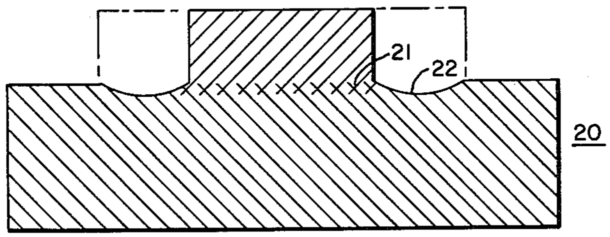
FIG. 3 is an enlarged cross sectional view of a semiconductor device prepared in accordance with the process of the invention.

Referring to FIG. 3, there is shown a semiconductor device 20 after etching in accordance with the above process. As may be seen from the figure, a substantial portion of the peripheral area 24 about the p-n junction 21 was removed and was effective in attaining a 10:1 peak-to-valley current ratio.

It will be understood that while the invention is applicable to freshly made devices, it can be applied to tunnel diodes previously made and etched by other techniques so as to improve them.

It is to be understood that the above description and drawings be interpreted as illustrative and not limiting.

I claim as my invention:

1. In the process of making a semiconductor device having a p-n junction portion with predetermined tunnel diode characteristics, the steps comprising preparing the device with the p-n junction portion processed to provide the tunnel characteristics in a degree less than optimally possible, there being leads attached to each side of said p-n junction; applying to the portion a chemical etchant equivalent to that produced by admixing the following components by volume from 1 to 10 parts of fuming red nitric acid (90%), from 1 to 15 parts of acetic acid (80%), from 1 to 10 ml. of hydrofluoric acid (50% HF) and from 0.1 to 4 ml. of bromine per 100 ml. of solution; passing a forward current through the leads to the p-n junction as etching progresses to measure substantially continuously the peak-to-valley current ratio at the junction without removing the device from contact with the etchant and continuing etching until the desired peak-to-valley current ratio at the junction is attained.

2. In the process of making a semiconductor device having a p-n junction portion with predetermined tunnel diode characteristics, the device having the p-n junction portion with tunnel characteristics in a degree less than optimally possible, there being leads attached to each side of said p-n junction; the steps comprising applying to the portion a chemical etchant comprising by volume 5 parts of 90% fuming red nitric acid, 10 parts of 80% acetic acid, 3 ml. of 50% hydrofluoric acid and 0.5 ml. of bromine per 100 ml. of solution; passing a forward current through the leads to the p-n junction as etching progresses to measure substantially continuously the peak-to-valley current ratio at the junction without removing the device from contact with the etchant and continuing etching until there is obtained a peak-to-valley ratio of at least approximately 10:1 for germanium.

3. In the process of making a semiconductor device having a p-n junction portion with predetermined tunnel diode characteristics, the device having the p-n junction portion with tunnel characteristics in a degree less than optimally possible, the device comprising a semiconductor material selected from the group consisting of silicon, germanium and gallium arsenide, there being leads attached to each side of said p-n junction; the steps comprising applying to the portion a chemical etchant comprising by volume, about 5 parts of 90% fuming red nitric acid, about 10 parts of 80% acetic acid, about 3 parts of 50% hydrofluoric acid and about 0.5 ml. of bromide per 100 ml. of solution; passing a forward current through the leads to the p-n junction as etching progresses and measuring substantially continuously the peak-to-valley current ratio at the junction without removing the device from contact with the etchant, and continuing eching until there is obtained a peak-to-valley ratio of at least approximately 10:1 for germanium, 6:1 for silicon and 60:1 for gallium arsenide.

References Cited in the file of this patent

UNITED STATES PATENTS

| | | |
|---|---|---|
| 2,364,501 | Wolfskill | Dec. 5, 1944 |
| 2,619,414 | Heidenreich | Nov. 25, 1952 |
| 2,806,807 | Armstrong | Sept. 17, 1957 |
| 2,846,346 | Bradley | Aug. 5, 1958 |

FOREIGN PATENTS

| | | |
|---|---|---|
| 819,074 | Great Britain | Aug. 26, 1959 |

OTHER REFERENCES

Germanium and Silicon Tunnel Diodes Lesk et al. from General Electric Semi Conductor Dept., Syracuse, N.Y. 1 RE Wescon Convention Record, Part 3, Electron Devices August 18–21, 1959, TK 6541–I 55 W, pages 9–31.

Etchant Esaki Diodes by Davis, IBM Tech. Disclosure Bulletin, vol. 3, No. 9, February 1961, pages 26, 27.